(12) United States Patent
Park

(10) Patent No.: US 6,667,921 B2
(45) Date of Patent: Dec. 23, 2003

(54) BITLINE PRECHARGE CIRCUIT AND METHOD IN SEMICONDUCTOR MEMORY DEVICE

(75) Inventor: San-Ha Park, Ichon-shi (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 0 days.

(21) Appl. No.: 10/319,289

(22) Filed: Dec. 13, 2002

(65) Prior Publication Data

US 2003/0123311 A1 Jul. 3, 2003

(30) Foreign Application Priority Data

Dec. 31, 2001 (KR) .......................... 2001-88702

(51) Int. Cl.$^7$ ............................... G11C 7/00
(52) U.S. Cl. .................. 365/203; 365/189.11
(58) Field of Search ................... 365/203, 189.11, 365/205, 207, 194

(56) References Cited

U.S. PATENT DOCUMENTS 6,021,072 A * 2/2000 Takeda et al. ......... 365/189.11
6,108,256 A * 8/2000 Schneider .................. 365/203

* cited by examiner

*Primary Examiner*—Anh Phung
(74) *Attorney, Agent, or Firm*—Marshall, Gerstein & Borun LLP

(57) ABSTRACT

A bitline precharge circuit and a method for precharging bitlines in a semiconductor memory device are described herein. The bitline precharge circuit includes a driving control unit configured to output a VDD driving signal and a VPP driving signal in response to a bitline precharge enable signal, a precharge circuit driving unit configured to output bitline precharge signal of a power supply voltage VDD level or a boosted voltage VPP level in response to the VDD driving signal or the VPP driving signal, and a bitline precharge unit configured to precharge bitlines in response to the bitline precharge signal. A voltage level of the bitline precharge signal reaches the VDD level for a predetermined time from an enabled starting point of the bitline precharge enable signal, and then the voltage level of the bitline precharge signal reaches the VPP level after the predetermined time.

10 Claims, 7 Drawing Sheets

BITLINE PRECHARGE CIRCUIT AND METHOD IN SEMICONDUCTOR MEMORY DEVICE

TECHNICAL FIELD

The present disclosure relates generally to semiconductor memory devices, and more particularly, to a bitline precharge circuit and a method for precharging bitlines in a semiconductor memory device.

BACKGROUND

Recently, there is a need for a semiconductor memory device with high integration and a high operation speed. A low voltage or low power memory device has been developed to secure reliable operation in a low power. In particular, a memory device built in a portable system, e.g., a mobile phone or a notebook computer used outside of an office, has been developed to consume minimum power.

One of the above efforts is to minimize current consumption in a core area of a memory device. The core area, which consists of memory cells, bitlines, and wordlines, is designed according to an extremely minute design rule so that the memory cell has a very small size and operates in a low power.

A bitline precharge operation is important to cell data access speed. The bitline precharge is used to enhance an access time of cell data, '1' or '0', by precharging the bitlines with a predetermined voltage level (currently, "half-Vcc" level is commonly used) before accessing the cell data.

FIG. 1 is a block diagram showing a conventional bitline precharge circuit. The bitline precharge circuit includes a driving control unit 100, a precharge circuit driving unit 200 and a bitline precharge unit 300. The driving control unit 100 receives a bitline precharge enable signal as an input, and the precharge circuit driving unit 200 receives a VDD driving signal of a power supply voltage level from the driving control unit 100. The bitline precharge unit 300 precharges bitlines in response to a bitline precharge signal BLEQ provided by the precharge circuit driving unit 200. The bitline precharge unit 300 may be included in a cell array or positioned at an edge of the cell array.

The driving control unit 100 is configured with a converter chain as shown in FIG. 2A, and the precharge circuit driving unit 200 is configured with an inverter structure as shown in FIG. 2B. Referring to FIG. 2C, the bitline precharge unit 300 is configured with a number of transistors to precharge and to equalize a pair of bitlines BITBi and BITTi with a precharge voltage VBLP in response to the bitline precharge signal BLEQ.

Referring back to FIG. 1, the driving control unit 100 outputs the VDD driving signal in response to the bitline precharge enable signal. Then, the VDD driving signal is inputted into the precharge circuit driving unit 200, which in turn, generates the bitline precharge signal BLEQ. The bitline precharge unit 300 precharges the bitlines in response to the bitline precharge signal BLEQ.

When the conventional bitline precharging method is applied to the low power memory device, there is a problem in a parameter tRP related to a bitline precharging time because of a speed delay caused by a relatively high back bias and a low power supply voltage. To solve this problem, a boosted voltage VPP, which has a higher voltage level than that of an external power supply voltage, is used as a driving voltage of the bitline precharge transistors. For example, a VPP driving signal is outputted from the driving control unit 100 as shown in FIG. 1.

FIG. 3 shows simulation results of signals used in the operation of the circuit shown in FIG. 1, which represents driving results when using driving voltages VDD and VPP. When the boosted voltage VPP is employed instead of the power supply voltage VDD, a precharging time of the bitline BL is improved by as much as 13.2 nanoseconds as shown in FIG. 3. However, when the precharging method using the boosted voltage VPP is applied to a field of operational voltage below 2.0 V, there is a problem with the drivability of the boosted voltage VPP being substantially deteriorated. That is, the power supply voltage is boosted by as much as 10% to 50% of the power supply voltage level to make a boosted voltage of about 3.6 V from a power supply voltage of 2.5 V to 3.3 V. Further, to make the boosted voltage of about 3.6 V from a power supply voltage of 1.5 V to 1.8 V, the power supply voltage has to be boosted over 100% of the power supply voltage level. As a result, the drivability of the boosted voltage is considerably deteriorated.

Accordingly, when the bitline precharging transistors (NMOS transistors shown in FIG. 2C) are driven by the boosted voltage, the level of the boosted power voltage VPP is dropped. When the boosted power voltage VPP is dropped, an operational speed precharging the bitlines is delayed and the wordline enabling time driven by the boosted power VPP voltage will also be delayed. Further, as the voltage level of the boosted power voltage VPP is dropped, a refresh problem may occur.

SUMMARY OF THE DISCLOSURE

A bitline precharging circuit configured to enhance a precharge operation in a semiconductor memory device without an operational steed delay is described herein. The bitline precharging circuit is configured to minimize power consumption in a bitline precharging operation in the semiconductor memory device. Further, a method for precharging bitlines capable of minimizing power consumption in a bitline precharging operation in the semiconductor memory device is also described herein.

The bitline precharge circuit comprises: a driving control unit configured to output a VDD driving signal and a VPP driving signal in response to a bitline precharge enable signal; a precharge circuit driving unit configured to output a bitline precharge signal of a power supply voltage VDD level or a boosted voltage VPP level in response to the VDD driving signal or the VPP driving signal; and a bitline precharge unit configured to precharge bitlines in response to the bitline precharge signal. A voltage level of the bitline precharge signal reaches the VDD level for a predetermined time from an enabled starting point of the bitline precharge enable signal, and then the voltage level of the bitline precharge signal reaches the VPP level after the predetermined time.

The method for precharging bitlines in a semiconductor memory device comprises: a) inputting a precharge command into the semiconductor memory device; b) enabling a bitline precharge enable signal after the step a); c) enabling a VDD driving signal for a predetermined time from an enabled starting point of the bitline precharge enable signal; d) firstly pulling up a voltage level of the bitline precharge signal to a VDD level in response to the VDD driving signal; e) enabling a VPP driving signal from a moment which the VDD driving signal is disabled; and f) secondly pulling up the voltage level of the bitline precharge signal to a VPP level in response to the VPP driving signal.

BRIEF DESCRIPTION OF THE DRAWINGS

The disclosure will be described in terms of several embodiments to illustrate its broad teachings. Reference is also made to the attached drawings.

DETAILED DESCRIPTION

Figure 4:
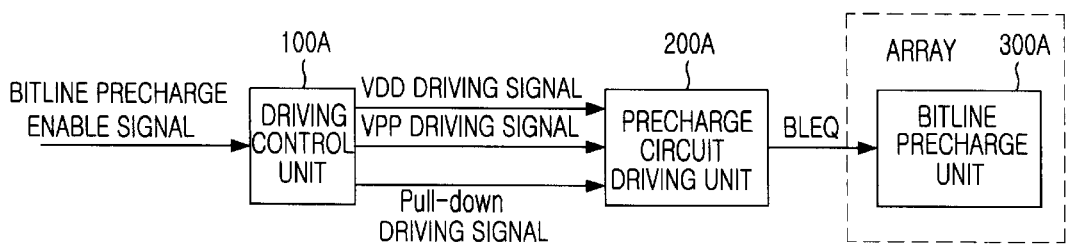
FIG. 4 is a block diagram of a bitline precharge circuit.

The present disclosure will be described in detail with reference to the accompanying drawings. In particular, FIG. 4 is a block diagram illustrating a bitline precharge circuit. The bitline precharge circuit includes a driving control unit 100A, a precharge circuit driving unit 200A, and a bitline precharge unit 300A.

The driving control unit 100A outputs a VDD driving signal and a VPP driving signal in response to a bitline precharge enable signal. The precharge circuit driving unit 200A outputs the bitline precharge signal BLEQ of a VDD level or a VPP level in response to the VDD driving signal or the VPP driving signal, respectively, from the driving control unit 100A. The VPP level is a boosted voltage level of the power supply voltage VDD level. The bitline precharge unit 300A precharges bitlines in response to the bitline precharge signal BLEQ from the precharge circuit driving unit 200A. The bitline precharge unit 300A may be included in a cell array or connected to an edge of the cell array.

Because the bitline precharge circuit in FIG. 4 employs either the power supply voltage VDD or the boosted voltage VPP as its driving voltage, current consumption and load of the boosted voltage VPP can be reduced so that an operational speed for precharging the bitlines can be enhanced. The driving control unit 100A separately outputs a pull-down driving signal to prevent the pull-down driving signal from being essentially generated according to a configuration of the driving control unit 100A or the precharge circuit driving unit 200A.

Figure 5:
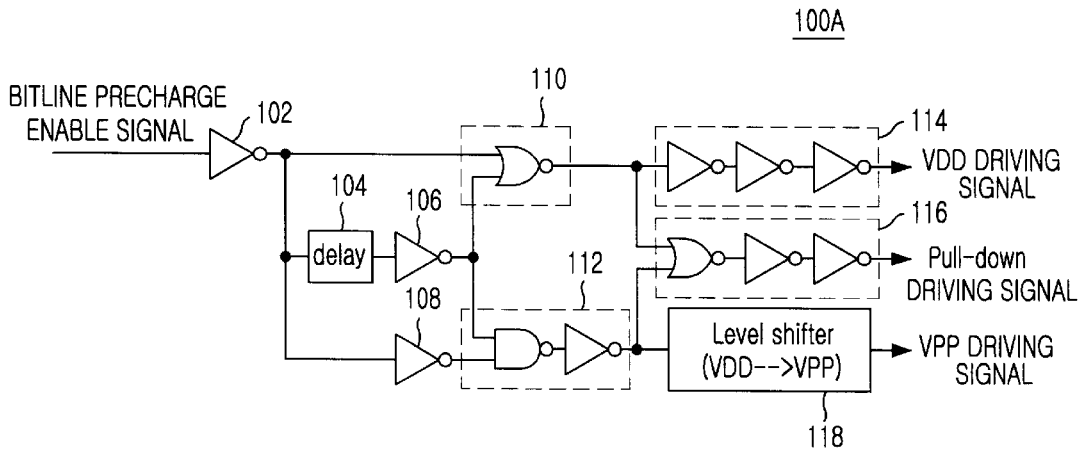
FIG. 5 is a detailed circuit diagram of a driving control unit 100A shown in FIG. 4.

As shown in FIG. 5, the driving control unit 100A includes an input unit 102, a delay unit 104, a first decoding unit 110, a second decoding unit 112, a VDD output unit 114, a VPP output unit 118, and a pull-down driving signal output unit 116.

The input unit 102 receives the bitline precharge enable signal as an input, and the delay unit 104 delays an output of the input unit 102. The first decoding unit 110, which is composed of a NOR gate, decodes outputs of the input unit 102 and the delay unit 104. The second decoding unit 112, which is composed of a NAND gate and an inverter, decodes outputs of the input unit 102 and the delay unit 104. The VDD output unit 114 outputs the VDD driving signal by amplifying an output of the first decoding unit 110, and the VPP output unit 118 outputs the VPP driving signal by level-shifting an output of the second decoding unit 112. The pull-down driving signal output unit 116 outputs the pull-down driving signal by combining outputs of the first decoding unit 110 and the second decoding unit 112.

An inverter of the input unit 102 is configured to buffer the bitline precharge enable signal, and inverters 106 and 108 are employed to match logic states of the inputs of the first and the second decoding units 110 and 112. Accordingly, the inverters 106 and 108 may be omitted considering circuit logic states or designs of other types. The VDD output unit 114 is composed of three inverters, and the VPP output unit 118 is implemented with a level shifter. The pull down driving signal output unit 116 is composed of a NOR gate and two inverters connected in a serial fashion. As a result, the delay circuit 104 is to enable the VDD driving signal for a predetermined period to adjust the bitline precharge operation.

Figure 6:
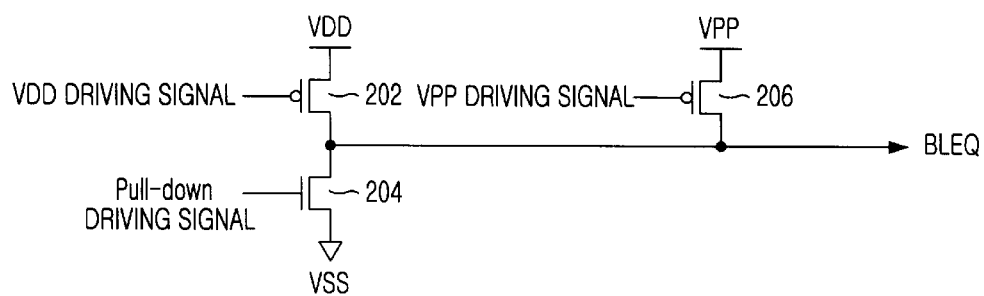
FIG. 6 is a detailed circuit diagram of a precharge circuit driving unit 200A shown in FIG. 4.

Referring to FIG. 6, the precharge circuit driving unit 200A includes a first PMOS transistor 202 configured to pull up an output signal BLEQ with VDD in response to the VDD driving signal, a second PMOS transistor 206 configured to pull up the output signal BLEQ with VPP in response to the VPP driving signal, and an NMOS transistor 204 configured to pull down a voltage level of the output signal BLEQ in response to the pull-down driving signal.

Each of the transistors 202, 204 and 206 may be designed with a large width to be sufficiently driven in response to the corresponding driving signal. Also, the configuration of the precharge circuit driving unit 200A may be changed, and the circuit configuration of the driving control unit 100A in FIG. 5 may change according to that of the precharge circuit driving unit 200A.

Figure 1:
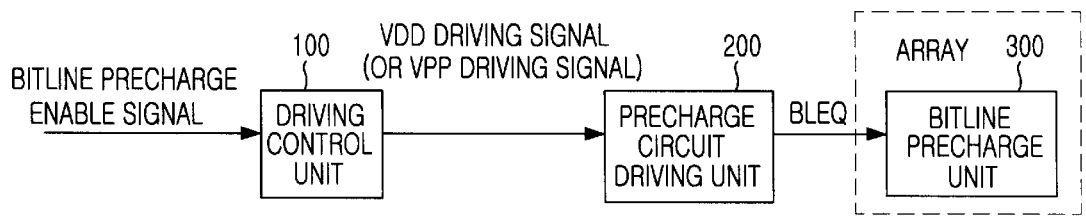
FIG. 1 is a block diagram of a conventional bitline precharge circuit.
Figure 2A:
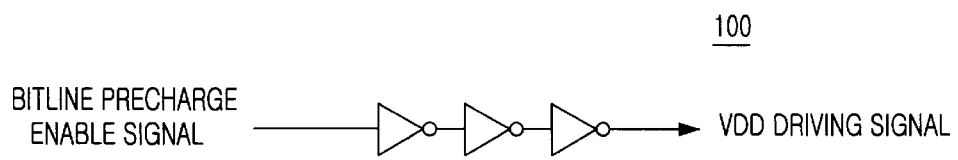
FIG. 2A is a detailed circuit diagram of a driving control unit 100 shown in FIG. 1.
Figure 2B:
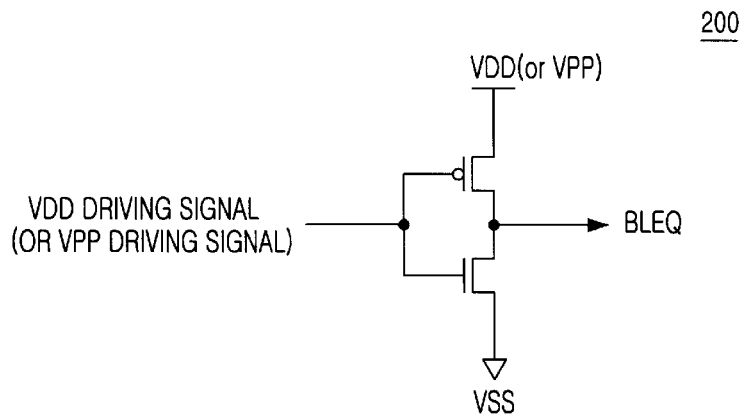
FIG. 2B is a detailed circuit diagram of a precharge circuit driving unit 200 shown in FIG. 1.
Figure 2C:
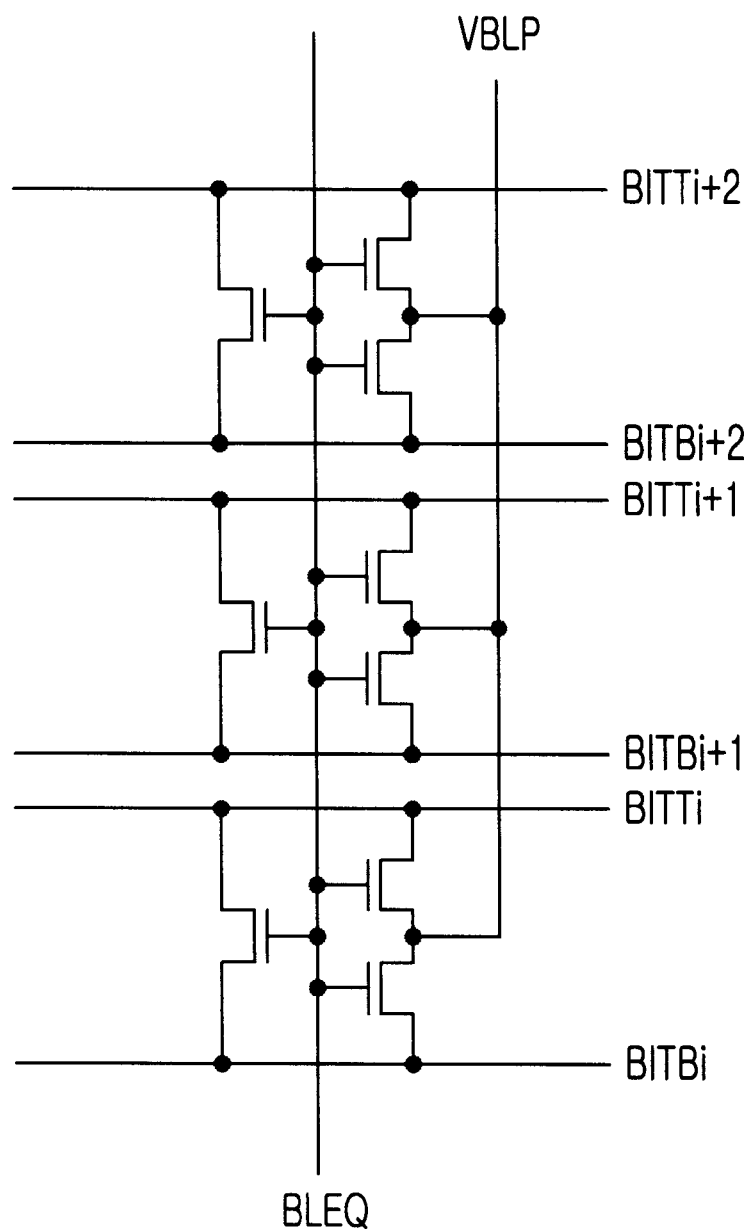
FIG. 2C is a detailed circuit diagram of a bitline precharge unit 300 shown in FIG. 1.
Figure 3:
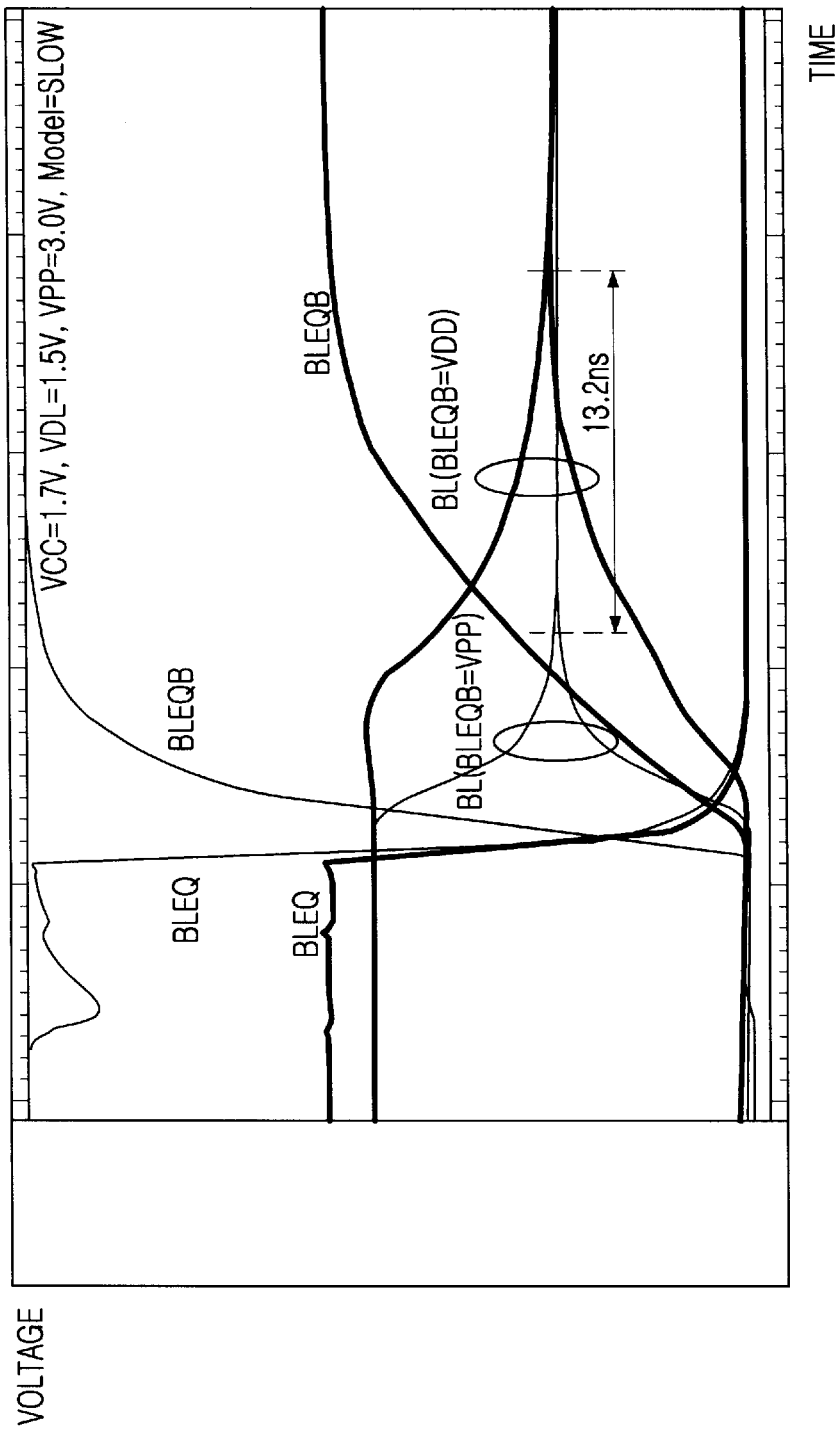
FIG. 3 is a waveform diagram showing a simulation result of the conventional bitline precharge circuit shown in FIG. 1.
Figure 7:
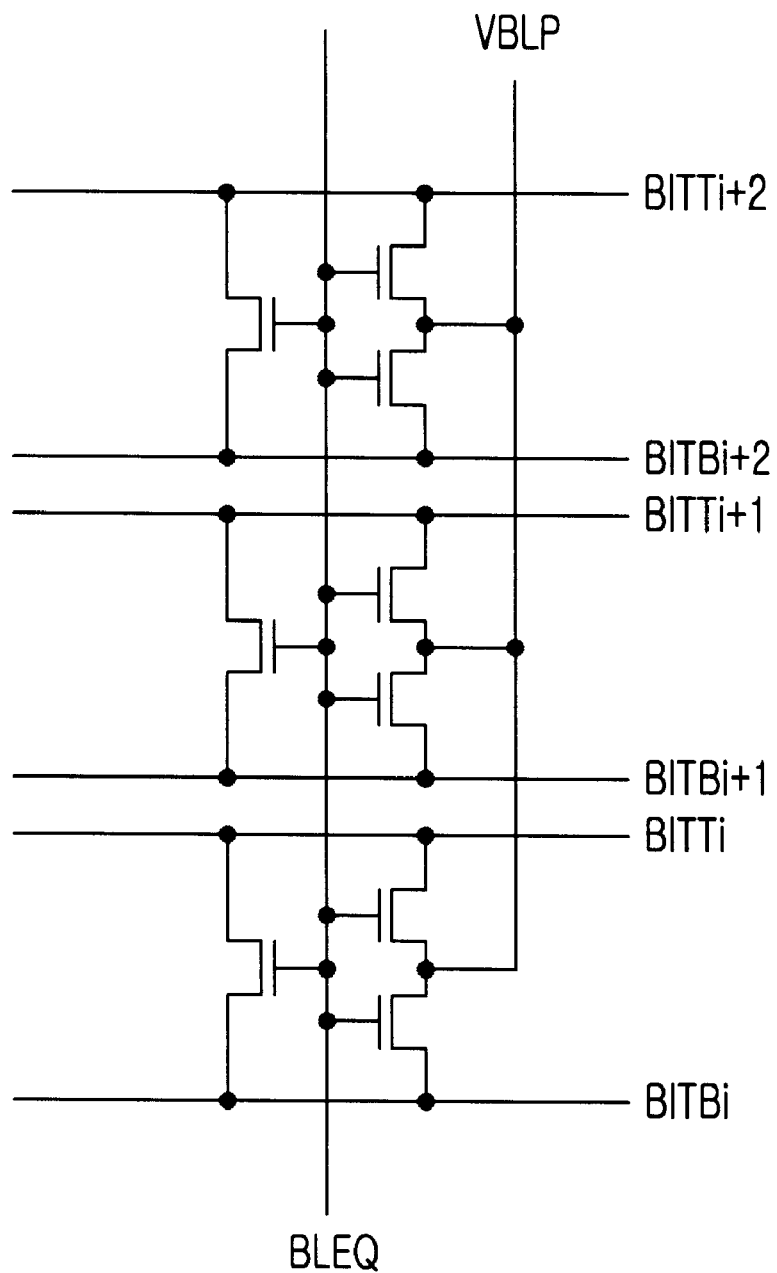
FIG. 7 is a detailed circuit diagram of a bitline precharge unit 300A shown in FIG. 4.

FIG. 7 is a detailed circuit diagram of the bitline precharge unit 300A shown in FIG. 4. The bitline precharge unit 300A includes bitline precharge transistors employed for each sense amplifier. The configuration of the bitline precharge unit 300A is identical to that of the bitline precharge unit 300 in FIG. 2C as persons of ordinary skills in the art will readily recognize.

Figure 8:
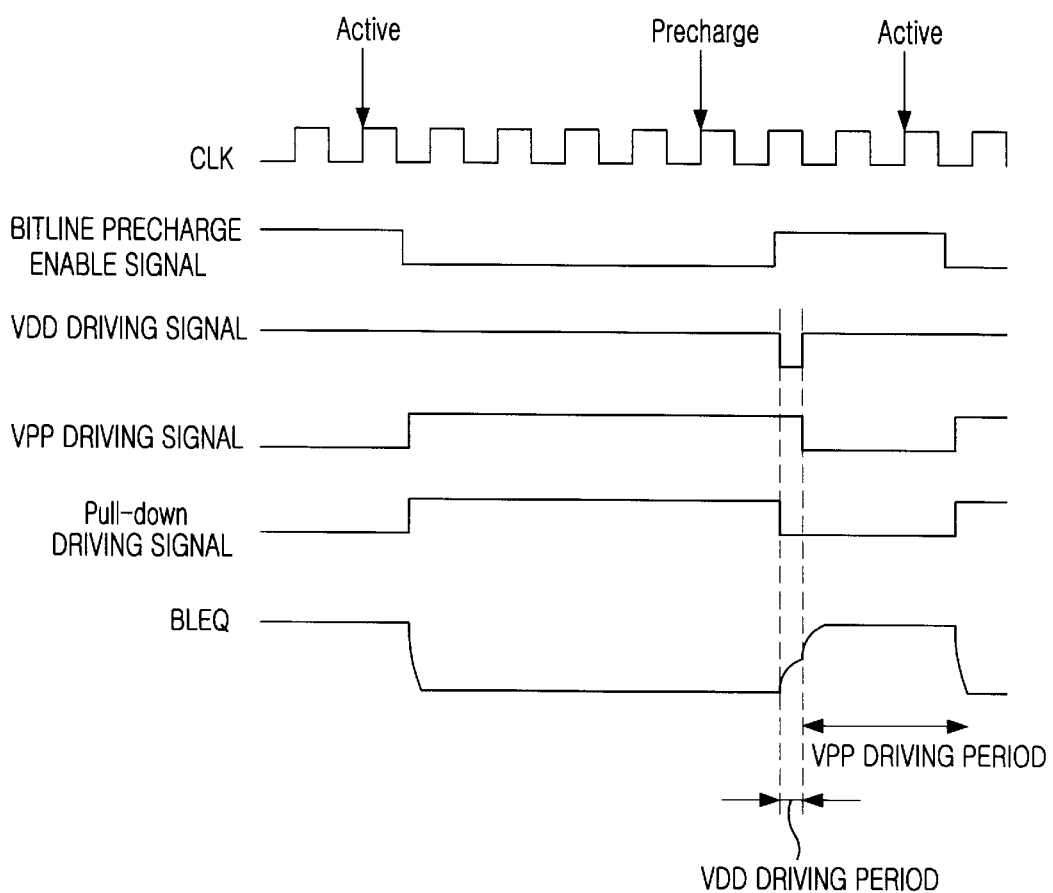
FIG. 8 is a timing diagram showing an operation of the bitline precharge circuit shown in FIG. 4.

FIG. 8 is a timing diagram showing an operation of the bitline precharge circuit shown in FIG. 4. After an active command is inputted to a memory device, the bitline precharge enable signal is enabled as an active 'high' state if a precharge command is inputted. Then, the driving control unit 100A, to which the bitline precharge enable signal is inputted, generates the VDD driving signal to be enabled at an active 'low' state for a predetermined period from an enabled starting point of the bitline precharge enable signal. Subsequently, the VPP driving signal is enabled as an active 'low' state for a period from when the VDD driving signal is disabled to when the bitline precharge enable signal is disabled. The period, in which the VDD driving signal is enabled, is set to a moment when a voltage level of the bitline precharge signal BLEQ reaches a VDD level, i.e., a power supply voltage level or an operational voltage level.

After a level of the bitline precharge signal BLEQ is precharged to a predetermined level according to the VDD driving signal, the bitline precharge signal BLEQ reaches the VPP level according to the VPP driving signal. The pull-down driving signal outputted from the pull-down driving signal output unit 116 shown in FIG. 5 is enabled to an active 'high' state after both the VDD driving signal and the VPP driving signal are disabled.

The VDD driving signal and the VPP driving signal generated from the driving control unit 100A are inputted into the precharge circuit driving unit 200A, and then the precharge signal BLEQ is generated. The bitline precharge transistors shown in FIG. 7 are operated in response to the precharge signal BLEQ so that the bitline precharge operation is enabled.

Because the bitline precharge signal is directly boosted to the VPP level from the initial operation in the prior art, there is a problem that current consumption is largely increased (it is a well-known fact that current consumption is increased when a swing level is high). In contrast, current consumption can be considerably decreased when the bitline is precharged into the VPP level after being previously precharged into the VDD level. Also, the drivability of the boosted voltage VPP is not largely deteriorated so that the precharge operation of the bitlines and the boosting operation of wordlines are improved.

Figure 9:
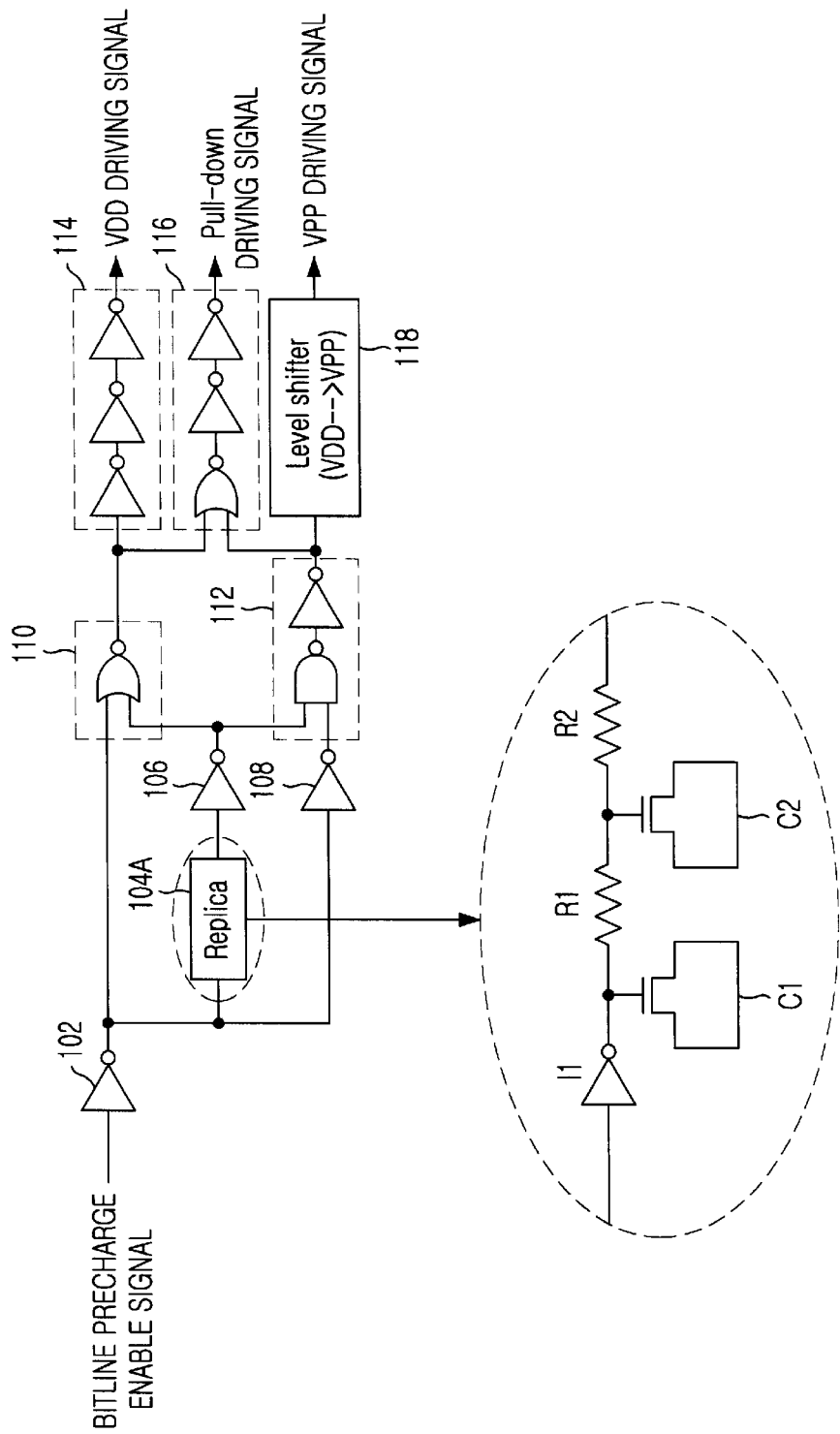
FIG. 9 is a detailed circuit diagram of the driving control unit 100A.

FIG. 9 is a circuit diagram showing the driving control unit 100A. The delay circuit 104 is employed in FIG. 5 whereas a replica 104A of a part of a bitline precharge signal is employed in FIG. 9. The replica 104A is configured by modeling the precharge circuit driving unit 200A and the bitline precharge circuit unit 300A of the memory cell array. When the bitline precharge signal is enabled, the VDD driving signal is disabled, and then the VPP driving signal is enabled. The replica circuit 104A can be implemented with inverters or RC delay.

In the disclosed bitline precharge circuit, a bitline precharge time tRP is remarkably improved compared to a conventional bitline precharge circuit using only VDD. In particular, the bitline precharge time tRP can be improved by more than 10 nanoseconds when the VDD is 1.6 V and the VPP is 2.8 V. Current consumption caused by the VPP can be decreased over 50% compared to the conventional VPP driving circuit, and a voltage level of VPP can be stabilized. Accordingly, deterioration of a refresh time can be prevented. Furthermore, the number of VPP generating circuits (not shown) may be decreased so that an area occupied by the VPP generating circuits may be reduced because current for driving VPP is reduced.

Many changes and modifications to the embodiments described herein could be made. The scope of some changes is discussed above. The scope of others will become apparent from the appended claims.

What is claimed is:

1. A bitline precharge circuit in a semiconductor memory device, the circuit comprising:
    a driving control unit configured to output a VDD driving signal and a VPP driving signal in response to a bitline precharge enable signal;
    a precharge circuit driving unit configured to output a bitline precharge signal of a power supply voltage VDD level or a boosted voltage VPP level in response to the VDD driving signal or the VPP driving signal; and
    a bitline precharge unit configured to precharge bitlines in response to the bitline precharge signal,
    wherein a voltage level of the bitline precharge signal reaches the VDD level for a predetermined time from an enabled starting point of the bitline precharge enable signal, and then the voltage level of the bitline precharge signal reaches the VPP level after the predetermined time.

2. The bitline precharge circuit as recited in claim 1, wherein the driving control unit includes a pull-down driving signal output unit configured to output a pull-down driving signal controlling a pull-down operation of the precharge circuit driving unit.

3. The bitline precharge circuit as recited in claim 2, wherein the driving control unit includes:
    an input unit configured to receive the bitline precharge enable signal;
    a delay unit configured to delay an output of the input unit;
    a first decoding unit configured to decode outputs of the input unit and the delay unit;
    a second decoding unit configured to decode outputs of the input unit and the delay unit;
    a VDD output unit configured to amplify and to provide an output of the first decoding unit;
    a VPP output unit for configured to level-shift and to provide an output of the second decoding unit; and
    a pull-down driving signal output unit configured to provide a pull-down driving signal by combining outputs of the first and the second decoding units.

4. The bitline precharge circuit as recited in claim 3, wherein the delay unit includes an inverter chain.

5. The bitline precharge circuit as recited in claim 3, wherein the delay unit includes a modeling circuit obtained by modeling the precharge circuit driving unit and a bitline precharge circuit unit in a memory cell array.

6. The bitline precharge circuit as recited in claim 3, wherein the precharge circuit driving unit includes:
    a first pull-up transistor configured to pull up an output node of the bitline precharge signal with a VDD level in response to the VDD driving signal;
    a second pull-up transistor configured to pull up the output node with a VPP level in response to the VPP driving signal; and
    a pull-down transistor configured to pull down the output node in response to the pull-down driving signal.

7. A method for precharging bitlines in a semiconductor memory device, the method comprising:
    a) inputting a precharge command into the semiconductor memory device;
    b) enabling a bitline precharge enable signal after the step a);
    c) enabling a power supply voltage VDD driving signal for a predetermined time from an enabled starting point of the bitline precharge enable signal;
    d) firstly pulling up a voltage level of the bitline precharge signal to a VDD level in response to the VDD driving signal;
    e) enabling a VPP driving signal from a moment which the VDD driving signal is disabled; and
    f) secondly pulling up the voltage level of the bitline precharge signal to a VPP level in response to the VPP driving signal.

8. The method as recited in claim 7 further comprising the step of disabling the bitline precharge signal by pulling down the voltage level of the bitline precharge signal.

9. The method as recited in claim 7 further comprising the step of disabling the bitline precharge signal by pulling down the voltage level of the bitline precharge signal when the bitline precharge enable signal is disabled.

10. The method as recited in claim 7 further comprising the step of disabling the VPP driving signal when the bitline precharge enable signal is disabled.

* * * * *

UNITED STATES PATENT AND TRADEMARK OFFICE
CERTIFICATE OF CORRECTION

PATENT NO.    : 6,667,921 B2                                                          Page 1 of 1
DATED         : December 23, 2003
INVENTOR(S)   : San-Ha Park It is certified that error appears in the above-identified patent and that said Letters Patent is hereby corrected as shown below:

<u>Title page,</u>
Item [75], Inventor, please delete "Ichon-shi" and replace with -- Kyoungki-do --.

Signed and Sealed this

Fourth Day of May, 2004

JON W. DUDAS
*Acting Director of the United States Patent and Trademark Office*